United States Patent [19]
Bollinger et al.

[11] Patent Number: 5,364,496
[45] Date of Patent: Nov. 15, 1994

[54] HIGHLY DURABLE NONCONTAMINATING SURROUND MATERIALS FOR PLASMA ETCHING

[75] Inventors: Lynn D. Bollinger, Ridgefield; Michael P. Power, Newtown; Richard R. Poole, Norwalk; George J. Gardopee, Southbury, all of Conn.

[73] Assignee: Hughes Aircraft Company, Los Angeles, Calif.

[21] Appl. No.: 110,021

[22] Filed: Aug. 20, 1993

[51] Int. Cl.⁵ .................... H01L 21/306; B44C 1/22
[52] U.S. Cl. .................... 156/643; 156/657; 156/345
[58] Field of Search ............ 156/643, 646, 657, 662, 156/345; 204/298.31, 298.33, 298.38

[56] References Cited
U.S. PATENT DOCUMENTS

| | | | |
|---|---|---|---|
| 4,400,235 | 8/1983 | Coquin et al. | 156/643 |
| 4,419,201 | 12/1983 | Levinstein et al. | 156/345 X |
| 4,473,455 | 9/1984 | Dean et al. | 156/345 X |
| 4,668,366 | 5/1987 | Zarowin | 156/345 X |
| 5,268,200 | 12/1993 | Steger | 156/345 X |

*Primary Examiner*—William Powell
*Attorney, Agent, or Firm*—Michael W. Sales; Wanda K. Denson-Low

[57] ABSTRACT

A support and positioning apparatus (10) for supporting and positioning a wafer (12), substrate or the like in a plasma assisted chemical etching process. Surround components (14, 16, 18, 20) positioned around the substrate (12) are comprised of substantially pure magnesium or are aluminum coated with a magnesium fluoride coating such that as a plasma tool associated with the plasma etching process traverses the edge of the substrate (12), the plasma etching environment generated from a fluorine containing feed gas emitted from the plasma tool does not significantly erode the surround components (14, 16, 18, 20) or cause contamination of the substrate (12).

18 Claims, 1 Drawing Sheet

HIGHLY DURABLE NONCONTAMINATING SURROUND MATERIALS FOR PLASMA ETCHING

BACKGROUND OF THE INVENTION

1. Field of the Invention

This invention relates generally to a surround for use in a plasma etching process and, more particularly, to a noncorrosive and noncontaminating magnesium surround for use in a plasma assisted chemical etch process.

2. Discussion of the Related Art

Plasma assisted chemical etch (PACE) is a known etching process by which a plasma generates chemically reactive species from a gas, such as a fluorine containing gas (e.g., $CF_4$, $SF_6$). A well known application of plasma etching is etching patterns into semiconductor device wafers in which a photo-lithographically defined pattern acts as a resist to the plasma etch. Another application is to modify a substrate by moving a small confined plasma over the surface of the substrate. Other applications include silicon-on-insulator (SOI) thinning, thickness variations of a substrate such as flattening of silicon wafers, and correcting the figure of an optical surface. For an example of SOI thinning, see U.S. patent application Ser. No. 07/696,897 filed May 7, 1991, U.S. Pat. No. 5,254,830, and for an example of alteration of an optical surface see U.S. Pat. No. 4,668,366 issued to Zarowin.

During the PACE process, an article being modified is secured to a platform within a vacuum chamber associated with a plasma reactor, and a plasma tool is positioned relative to the article. A feed gas (e.g., $CF_4$, $SF_6$) is introduced by the plasma tool into the plasma reactor chamber where the plasma generates chemically reactive species from the feed gas. The chemically reactive species interact with the substrate surface to form volatile by-products which etch the surface of the article. The chemical interaction rate may be increased by a flow of plasma generated excited species, low energy ions and excited neutral species to the surface.

A plasma etching system for modifying the substrate by the PACE process typically has three major components. These components include a device to measure the thickness profile of the article which is to be modified, computational hardware and software to provide a plasma tool velocity/position map based on the measured starting layer thickness profile, the desired thickness profile, and the plasma etch parameters which are to be used, and material removal hardware to execute the plasma tool motion and make the layer profile modifications.

When making a correction to the surface of the article by the PACE process, the plasma tool is scanned over the surface in relation to a dwell-time map that is calculated from a map of the corrections to be made and the plasma tool removal characteristics. To make an accurate correction of the article being modified, the plasma tool must be scanned over the edge of the article onto what is referred to as the surround. As is apparent from the name, the surround is the area surrounding the article being modified. The plasma tool motion as it moves off the article and onto the surround is given by the dwell-time map. The surround size should extend beyond the article being corrected by an amount that allows the full area of the plasma tool to be moved off of the article and onto the surround. In other words, it is necessary that the plasma tool be moved off of the article and onto the surround by such a degree that the plasma tool no longer causes material to be removed from the article. The above referenced patent application and patent provide a more detailed discussion of this process.

As is clear from the discussion above, the surround is subjected to the same etching removal process as the article being modified. Therefore, in applications in which repeated corrections are to be made using the same surround, erosion of the surround becomes a problem in that the surround may be etched along with the article. Further, residual byproducts of long term exposure to the PACE environment, as would occur in a production application, are deposited in the plasma reactor region. This deposition will cause particles on the article surface to act as micromasks to the plasma removal leaving corresponding microscopic bumps in the final surface of the article.

To reduce the effects of contamination, it has been known in the art to make the surround out of the same material as the article being modified. Consequently, the surround is etched at substantially the same rate as the article being modified during the PACE process. Therefore it becomes necessary to replace the surround at regular intervals. Since the PACE process is a vacuum process, replacement of the surround in a high volume production application in which the plasma apparatus is kept under vacuum results in a significant added expense and complexity to the process. Therefore it becomes desirable to provide a surround which does not cause contamination to the article being modified, and further, does not significantly erode in the plasma environment.

What is needed then is a surround consisting of a material which is not significantly eroded during the PACE process, and which does not contaminate the plasma reactor area or the article being modified. It is therefore an object of the present invention to provide such a surround.

SUMMARY OF THE INVENTION

This invention discloses a surround for a wafer, substrate or the like applicable to be used in a plasma assisted chemical etch process utilizing a fluorine containing gas. The surround is comprised of substantially pure magnesium or aluminum coated with a magnesium fluoride coating such that the plasma etching environment does not cause significant erosion of the surround material, nor causes the surround material to contaminate the substrate. In one embodiment, the surround includes a substrate support plate and a number of substrate stops.

Additional objects, advantages, and features of the present invention will become apparent from the following description and appended claims, taken in conjunction with the accompanying drawings.

DETAILED DESCRIPTION OF THE PREFERRED EMBODIMENT

The following discussion of the preferred embodiments concerning a plasma etching surround are merely exemplary in nature and are in no way intended to limit the invention or its application or uses.

Figure 1:
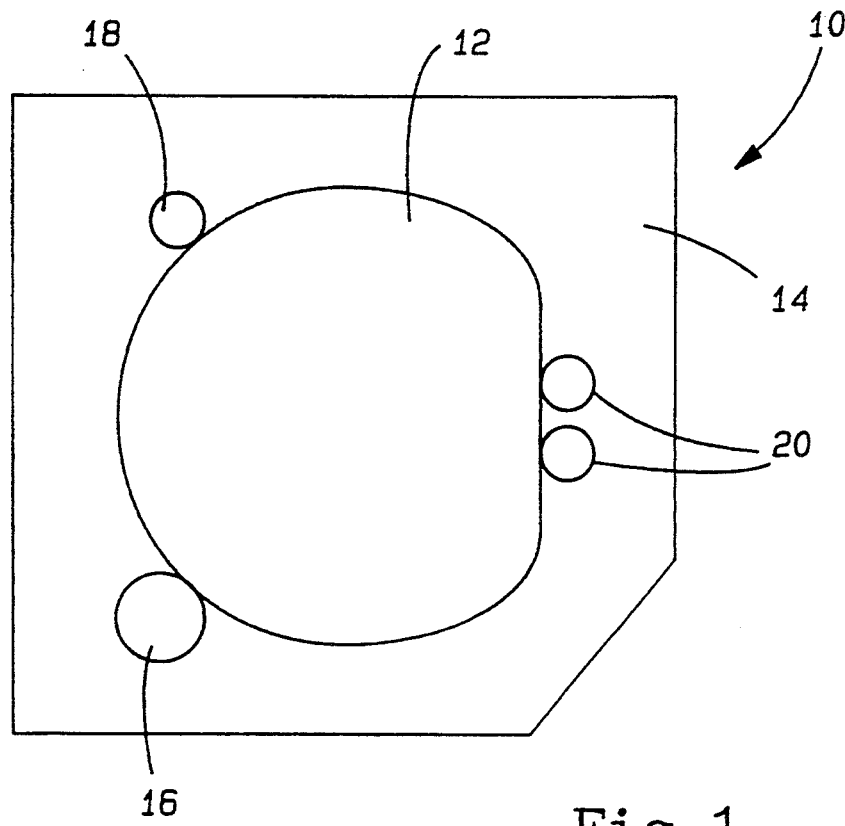
FIG. 1 is a top view of a plasma etching table incorporating a base plate surround according to a preferred embodiment of the present invention.

FIG. 1 shows a wafer support system 10 which is adaptable to support a silicon wafer 12 for plasma etching. The system 10 will be positioned within a vacuum chamber (not shown). Within the vacuum chamber is a plasma tool (not shown) associated with a plasma etching system. Chemically reactive species generated by the plasma from a fluorine containing gas, such as sulfur hexafluoride ($SF_6$) or carbon tetrafluoride ($CF_4$), interact with the surface of the wafer 12 to effect removal of material from the wafer 12 in a desirable manner. Plasma etching systems of this type are known in the art, and therefore, the particular components and their operation need not be shown or discussed here.

The wafer support system 10 includes a base plate 14 on which is configured a number of wafer positioning and holding buttons. Specifically, a positioning button 16 pushes the wafer 12 against an outer diameter wafer button stop 18 and against wafer flat button stops 20 such that the wafer 12 is rigidly held in place. The alignment, operation and configuration of the positioning button 16, and the wafer button stops 18 and 20 are well known in the art, and therefore, need not be discussed in detail here. It is noted that the wafer support system 10 may comprise wafer positioning and holding mechanisms for a plurality of wafers. A mechanism to precisely position and hold wafers for the PACE modification process has been described in U.S. patent application Ser. No. 07/937,793, filed Aug. 28, 1992.

The plasma tool will be positioned perpendicular to the base plate 14 and will scan across the wafer 12 during the plasma etching process in order to effect the etching of the surface of the wafer 12 in a manner as discussed above. In order for the plasma etching process to be effective, the plasma tool must travel beyond the edge of the wafer 12 until its alignment is completely off of the wafer 12. Therefore, it is desirable that the surrounding base plate 14, positioning button 16, and the button stops 18 and 20 be of a material which will not be significantly eroded by the etching process. Further, if erosion does occur, the eroded material will not contaminate the wafer 12.

In order to provide these desirable features, it is proposed that each of the base plate 14, the positioning button 16, and the button stops 18 and 20 have a magnesium fluoride ($MgF_2$) outer layer or be comprised substantially of pure magnesium. It has been found that the magnesium fluoride or magnesium metal does not significantly erode when subjected to a plasma generated with a fluorine containing gas, and further, does not cause any measurable contamination by magnesium or other products of the silicon wafer 12. It is believed that magnesium will develop a thin $MgF_2$ layer upon exposure to the etchant gas so as to behave like a $MgF_2$ coating.

In accordance with the teachings of the present invention, magnesium fluoride coatings could be deposited on each of the base plate 14, the positioning button 16 and the button stops 18 and 20 by a suitable deposition process such as electron beam vapor deposition, chemical vapor deposition or sputtering. Aluminum is a preferred base material because of the desirable qualities of ease of machining of aluminum, as well as its relative inertness. A typical thickness of magnesium fluoride coatings which provided desirable adhesion and surface characteristics was approximately 0.1 microns. Magnesium fluoride coatings of this thickness had widely spaced, microscopic pin holes (diameter on the order of a micron) as is typical of thin film coatings. For the $MgF_2$ coated aluminum, no degradation of the coating or contamination from the aluminum was found when subjected to the plasma etching environment. It is believed that any aluminum exposed through the microscopic pin holes was passivated rather than etched by the plasma that was generating reactive fluorine species. Further, erosion and contamination of aluminum was negligible or nonexistent. For large areas of bare aluminum with no $MgF_2$ coating, however, contamination from the aluminum surface after exposure to the etching plasma is clearly evident. It has been shown effective to provide a magnesium fluoride coating over silicon components, however, the pin hole effect caused some erosion of the silicon beneath the magnesium fluoride coating and would ultimately limit the lifetime of the coating.

Both the magnesium and magnesium fluoride coatings were found to be equally resistant to plasma erosion and to be non-contaminating. However, different applications may make one of the two more advantageous. For example, pure magnesium as a surround material is desirable in that it can be readily machined to a particular shape without an additional coating step. Further, the magnesium would not be subjected to damage by accidental abrasion. Of course, it is possible to use solid magnesium fluoride or magnesium coatings, however, fabrication limitations may make these applications less desirable.

Figure 2:
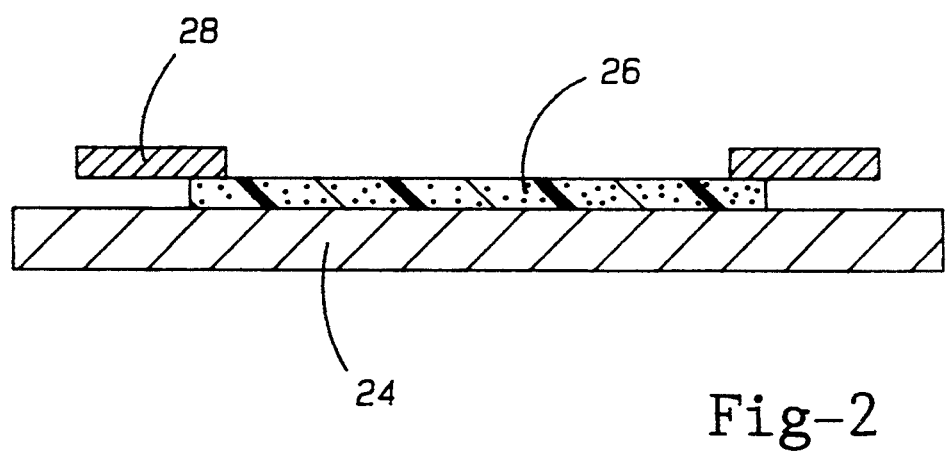
FIG. 2 is a cutaway side view of a substrate and surround for a plasma etching process according to a preferred embodiment of the present invention.

For particular applications in which it may not be advantageous to provide a magnesium or a magnesium fluoride coated base plate, wafer stops or other wafer holding and supporting devices, other types of surrounds may be provided. Turning to FIG. 2, a cross sectional view of a substrate table 24 is shown on which is positioned a substrate 26 and a surround annulus 28. The surround annulus 28 is a magnesium fluoride coated aluminum annulus or a pure magnesium annulus such that it completely surrounds the substrate 26. Therefore, as the plasma tool traverses an edge of the substrate 26, the plasma generated reactive and excited species will impinge the annulus 28. In this example, none of the wafer supporting devices will be impinged with the etchant species.

As is apparent by reviewing FIGS. 1 and 2, the surround base plate 14 of FIG. 1 and the surround annulus 28 of FIG. 2 are not on an even plane to that of the wafer 12 and the substrate 26. This may present some etching edge effects as the plasma tool traverses the edge of the wafers in that the rate of etching may be altered. However, such effects can be calibrated into the system due to the known parameters of the edge effects. It is possible to design a wafer holding system including a magnesium or magnesium fluoride surround in which the surround material would be substantially on the same plane as the wafer.

The above described embodiments are specifically directed to silicon wafer or substrate thinning. However, the disclosed invention is intended to provide a surround for all plasma assisted chemical etch processes using a fluorine containing gas.

The foregoing discussion discloses and describes merely exemplary embodiments of the present invention. One skilled in the art will recognize from such discussion, and from the accompanying drawings and claims, that various changes, modifications and variations can be made therein without departing from the spirit and scope of the invention as defined in the following claims.

What is claimed is:

1. A positioning and supporting apparatus for positioning and supporting an article in a plasma etching process employing a plasma tool, wherein the plasma etching process effects removal of surface material from the article, said positioning and supporting apparatus comprising:

a support area for accepting the article:

a surround adjacent the support area, said surround defining at least one surround component having an outer surface comprised of a magnesium material such that as the plasma tool employed in the plasma etching process traverses an edge portion of the article, chemically reactive and excited species generated by a feed gas from the plasma tool impinge upon the surround component.

2. The positioning and support apparatus according to claim 1 wherein the at least one surround component is comprised of substantially pure magnesium.

3. The positioning and support apparatus according to claim 1 wherein the at least one surround component is an aluminum component coated with magnesium fluoride.

4. The support and positioning apparatus according to claim 3 wherein the magnesium fluoride coating is approximately 0.1 microns thick.

5. The support and positioning apparatus according to claim 1 wherein the at least one surround component includes a base plate and a series of substrate stops.

6. The support and positioning apparatus according to claim 1 wherein the at least one surround component is an annulus positioned around the article.

7. The support and positioning apparatus according to claim 1 wherein the article is a silicon wafer.

8. A positioning and supporting apparatus for positioning and supporting a wafer in a plasma etching process employing a plasma tool, wherein the plasma etching process effects removal of surface material from the wafer, said positioning and supporting apparatus comprising:

a base plate for accepting the wafer, said base plate including an outer surface comprised of a magnesium material; and a plurality of wafer positioning mechanisms adaptable to secure the wafer to the base plate, said plurality of wafer supporting mechanisms including an outer surface comprised of a magnesium material such that as the plasma tool employed in the plasma etching process traverses an edge portion of the wafer, chemically reactive and excited species generated by a feed gas from the plasma tool impinge upon the magnesium surface of the base plate and the positioning mechanisms.

9. The positioning and supporting apparatus according to claim 8 wherein the base plate and the plurality of positioning mechanisms are comprised of substantially pure magnesium.

10. The positioning and support apparatus according to claim 8 wherein the base plate and the plurality of positioning mechanisms are aluminum coated with magnesium fluoride.

11. The support and positioning apparatus according to claim 10 wherein the magnesium fluoride coating is approximately 0.1 microns thick.

12. The support and positioning apparatus according to claim 8 wherein the plurality of wafer positioning mechanisms are three wafer button stops and a wafer button pushing mechanism.

13. A method of positioning and supporting an article in a plasma etching process employing a plasma tool, wherein the plasma etching process effects removal of surface material from the article, said method comprising the steps of:

providing a support for accepting the article; and providing a surround adjacent the support, said surround defining at least one surround component having an outer surface comprised of a magnesium material such that as the plasma tool employed in the plasma etching process traverses an edge portion of the article, chemically reactive and excited species generated by a feed gas from the plasma tool impinge upon the surround component.

14. The method according to claim 13 wherein the step of providing a surround includes providing a surround in which the at least one surround component is comprised of substantially pure magnesium.

15. The method according to claim 13 wherein the step of providing a surround includes providing a surround in which the at least one surround component is an aluminum component coated with magnesium fluoride.

16. The method according to claim 15 wherein the step of providing the surround includes providing a surround component having a magnesium fluoride coating of approximately 0.1 microns thick.

17. The method according to claim 13 wherein the step of providing a surround includes providing a base plate and a series of substrate stops.

18. The method according to claim 13 wherein the step of providing a surround includes providing a surround annulus positioned around the article.

* * * * *